United States Patent
Chang et al.

(10) Patent No.: US 10,116,316 B2
(45) Date of Patent: Oct. 30, 2018

(54) RECEIVER WITH SIGNAL PROCESSOR TO ADAPTIVELY UPDATE WEIGHTS TO SEPARATE LARGER AND SMALLER COMPONENTS

(71) Applicant: SPATIAL DIGITAL SYSTEMS, INC., Camarillo, CA (US)

(72) Inventors: Donald C. D. Chang, Thousand Oaks, CA (US); Frank Lu, Reseda, CA (US); Yulan Sun, Canoga Park, CA (US)

(73) Assignee: SPATIAL DIGITAL SYSTEMS, INC., Agoura Hills, CA (US)

( * ) Notice: Subject to any disclaimer, the term of this patent is extended or adjusted under 35 U.S.C. 154(b) by 0 days.

(21) Appl. No.: 15/008,580

(22) Filed: Jan. 28, 2016

(65) Prior Publication Data
US 2016/0142084 A1 May 19, 2016

Related U.S. Application Data

(63) Continuation of application No. 12/951,995, filed on Nov. 22, 2010, now Pat. No. 9,252,799.
(Continued)

(51) Int. Cl.
| | |
|---|---|
| *H04L 27/06* | (2006.01) |
| *H03M 1/00* | (2006.01) |
| *H03M 1/12* | (2006.01) |
| *H03M 1/06* | (2006.01) |
| *H04B 1/04* | (2006.01) |
| *H04B 7/10* | (2017.01) |
| *H03M 1/08* | (2006.01) |
| *H03M 1/18* | (2006.01) |
| *H03M 1/20* | (2006.01) |
| *H04B 1/12* | (2006.01) |

(52) U.S. Cl.
CPC ......... *H03M 1/002* (2013.01); *H03M 1/0641* (2013.01); *H03M 1/08* (2013.01); *H03M 1/12* (2013.01); *H03M 1/1205* (2013.01); *H03M 1/188* (2013.01); *H03M 1/20* (2013.01); *H04B 1/0475* (2013.01); *H04B 1/123* (2013.01); *H04B 7/10* (2013.01); *H04L 27/06* (2013.01); *H05K 999/99* (2013.01); *H03M 1/1215* (2013.01)

(58) Field of Classification Search
CPC .. H04B 1/7107; H04B 7/0408; H04B 7/0617; H04L 25/03057
See application file for complete search history.

(56) References Cited

U.S. PATENT DOCUMENTS

2005/0088338 A1\* 4/2005 Masenten ............ H01Q 3/2611
342/368

\* cited by examiner

*Primary Examiner* — David S Huang
(74) *Attorney, Agent, or Firm* — Phuong-Quan Hoang

(57) ABSTRACT

A receiver with orthogonal beam forming technique is achieved that is capable of differentiating different signal components within the received composite signal. An adaptive processor is used to eliminate the signal component whose phase information is known or can be calculated. The phase information of the major component of a signal can be easily acquired by using a limiter. The phase information of other signal components can be acquired by their direction information and other characteristics, such as modulation scheme, etc. Multiple orthogonal beams can be formed by eliminating one unwanted signal component each time by
(Continued)

the adaptive processor until all unwanted signal is eliminated. Thus, a composite signal from multiple sources can be broken down into their component signals.

20 Claims, 6 Drawing Sheets

Related U.S. Application Data

(60) Provisional application No. 61/381,381, filed on Sep. 9, 2010.

RECEIVER WITH SIGNAL PROCESSOR TO ADAPTIVELY UPDATE WEIGHTS TO SEPARATE LARGER AND SMALLER COMPONENTS

RELATED APPLICATION DATA

This application is a continuation of application Ser. No. 12/951,995, filed on Nov. 22, 2010, now issued as U.S. Pat. No. 9.252,799, which claims the benefit of U.S. provisional application Ser. No. 61/381,381, filed on Sep. 9, 2010.

BACKGROUND OF THE INVENTION

1. Field of the Invention

The present invention relates to the fields of wireless communications and antenna architecture and design, and, in particular, to adaptive smart antenna system architectures and designs. More specifically, but without limitation thereto, the present invention aims to create an antenna receiver system that is capable of forming multiple orthogonal beams and differentiating multiple received signals by eliminating signal components whose phase information or other characteristics are known or can be acquired.

2. Description of Related Art

In the field of wireless communications, antennas are widely used to transmit or receive data in the form of radio frequency signals from one place to another. Antennas are used in fields such as satellite, radio, television broadcasting, and cellular phone communications, among other things. These antennas can come in all shapes and sizes, ranging from traditional dish antennas, to antenna arrays that utilize multiple elements.

The performance of an antenna is degraded by the presence of an interfering signal, which can be defined as a signal originating from a source external to the desired signal path that produces undesired artifacts in the signal. This can be intentional interference, such as a jamming signal, or unintentional interference, such as receiving signals from a nearby satellite that is being broadcast on the same frequency. Additionally, when the strength of the interfering signal is too strong the communication quality becomes too low to maintain proper service.

Interference due to signal transmission on same frequencies can pose a problem for ground terminals attempting to transmit or receive signals from a desired source, such as a satellite. Several schemes have been designed to distinguish between signals. For example, digital and analog filters which may be easily implemented to differentiate received signals with different frequencies are widely used today. However, these systems do not present an adequate solution when the frequency of interfering signals are the same or very close to the desired signal.

One possible solution to overlapping frequency use is to use smart antennas equipped with digital beam forming (DBF) techniques to distinguish between signals originating from different directions by forming an orthogonal beam in the direction of the desired signal, while simultaneously forming a null at the direction of interfering sources. This provides an adequate solution to frequency use overlap as the antenna only picks up signals from the desired direction. While DBF techniques solve the issue of multi-directional, multi-signal interference, these smart antennas do not adequately solve the issue of multiple signal, differing strength signals being broadcast from relatively close directions The present invention takes advantage of the difference of signal strengths, corresponding directional information and other signal characteristics to calculate the phase information of unwanted signals and eliminate them using an adaptive algorithm. Different from other smart antennas utilizing beam-forming techniques, this invention focuses on eliminating unwanted signal components by adaptively minimizing the correlation between a desired signal and any unwanted components.

REFERENCES

1. Donald C. D. Chang et al, "Multiple Basestation Communication System Having Adaptive Antennas," Mar. 6, 2007, U.S. Pat. No. 7,187,949
2. Ying Feria et al, "Stratospheric-Based Communication System Having Interference Cancellation," May 18, 2010, U.S. Pat. No. 7,720,472

SUMMARY OF THE INVENTION

The present invention provides a dynamic communication system suitable for dynamically receiving incoming signals from multiple satellites to a receiver. More specifically, the present invention pertains to an adaptive signal differentiation scheme which is capable of distinguishing between signals by their strength difference and directional information.

An embodiment of the present invention comprises an antenna receiver system and a signal processing unit. With no limitation thereto, the antenna receiver for the current embodiment is an antenna array. Generally, a plurality of signals are received by the antenna system and then transmitted to the signal processing unit. There the processing unit coherently separates the signals using a system of weighting components and iterative loops, thus creating usable, separate signals.

Additionally, an embodiment of the present signal differentiation scheme further comprises a limiter, an adaptive processor and a phase alignment module. A limiter is an electronic device which simply converts a data sample greater or equal to zero into 1, and others into −1. Since the phase of a signal is determined mostly by the largest signal component of the signal, the output of the limiter approximately reflects the signal component with the strongest signal strength, and ignores all the amplitude information of input signals. The phase information is transmitted to the adaptive processor where a closed adaptive loop is used to iteratively eliminate the signal component which has the same phase as the strongest signal component, thus eliminating the strongest signal component of the signal. Similarly, other signal components can be eliminated if their phase information is known, or can be calculated, i.e. by their direction of arrival.

The present invention is not limited to one interfering source. In the case of multiple interfering sources, the present signal differentiation scheme may be applied to elimination of one interfering signal component at a time until all the interference is eliminated or differentiated into their component signals.

Additionally, other characteristics of a signal component, such as its modulation scheme can also provide useful information to generate an approximation of the signal component which can be used to eliminate the signal component in the adaptive processing.

DETAILED DESCRIPTION OF THE PREFERRED EMBODIMENT

The present invention relates to the field of communications systems and adaptive antenna design. More specifically, but without limitation thereto, the present invention provides an adaptive scheme which is capable of receiving and distinguishing between two or more radio frequency signals with differing signal strengths regardless of transmission directions.

Figure 1:
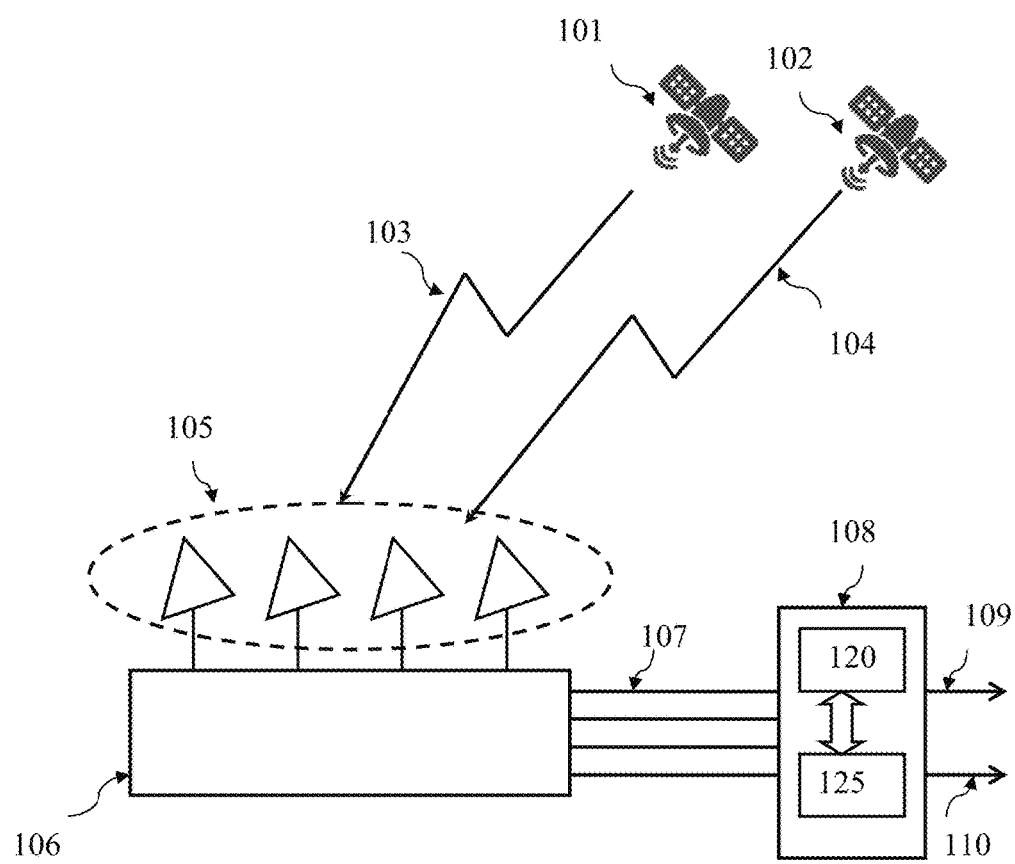
FIG. 1 illustrates an embodiment of the structure of the signal differentiation system.

As shown in FIG. 1, in an embodiment of the present invention, radio frequency (RF) signals 103, 104 transmitted from satellites 101, 102 are received by multiple-element antenna array 105. The signals from each satellite interfere with each other at the receiver side which means the composite signal received by each antenna element includes signals from both satellites. To distinguish these signals 103, 104 from each other, the received composite signal from each antenna element is first down-converted to base band and converted to digital signal 107 by the receiver module 106, and then transmitted to the digital signal processor 108 which utilizes an adaptive identification scheme to identify both signals 109, 110 individually based on their power difference and direction information.

Figure 2:
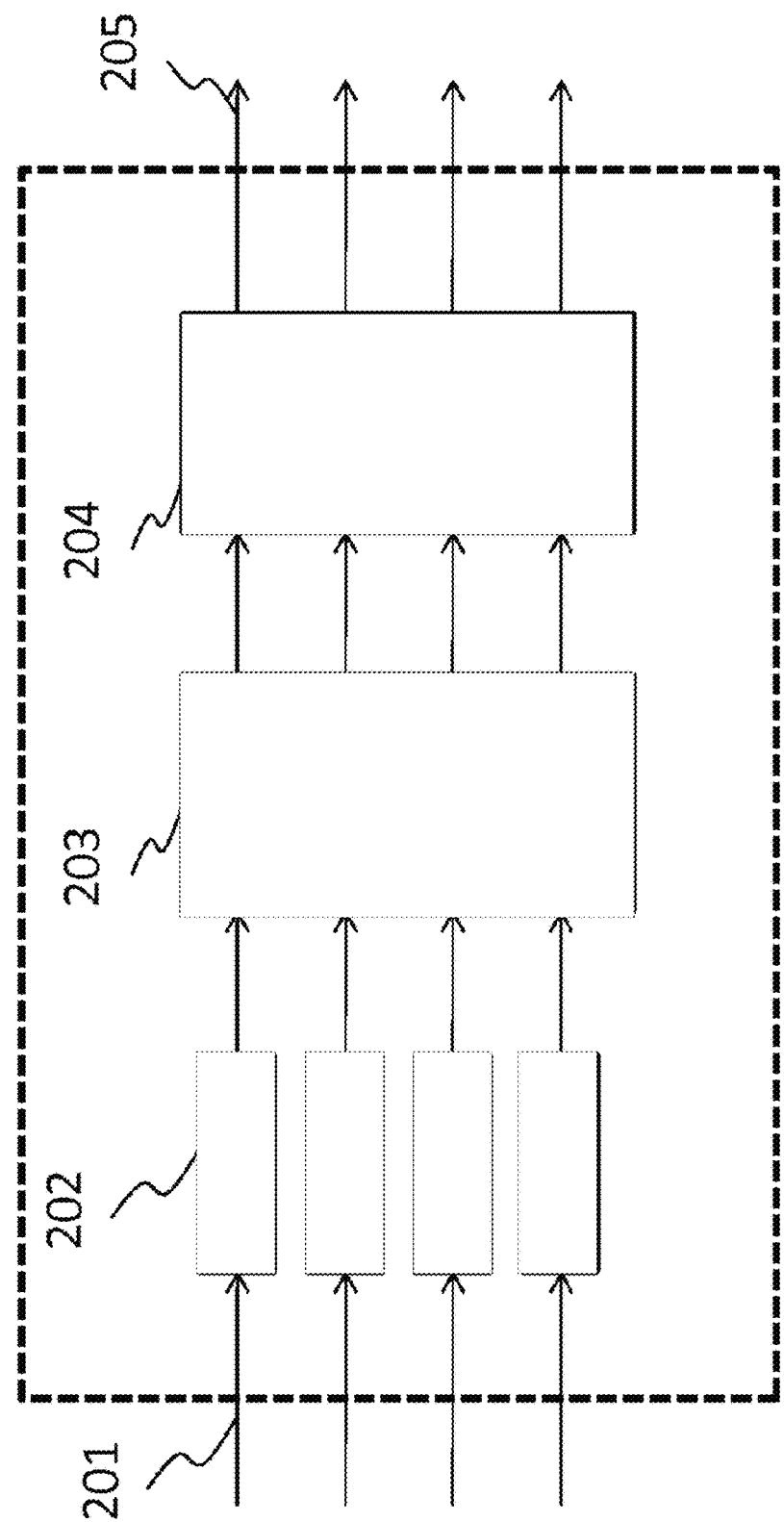
FIG. 2 shows a general structure of the signal receiver module.

FIG. 2 shows the general structure of receiver module in the present invention. The high frequency, analog signal 201 from each channel are treated by low noise amplifiers 202, and then down-converted to baseband by signal down-converters 203. The baseband analog signals are then converted to digital signals 205 by analog-to-digital (A/D) converters 204 and transmitted to signal identification module 108 as shown in FIG. 1.

Figure 3:
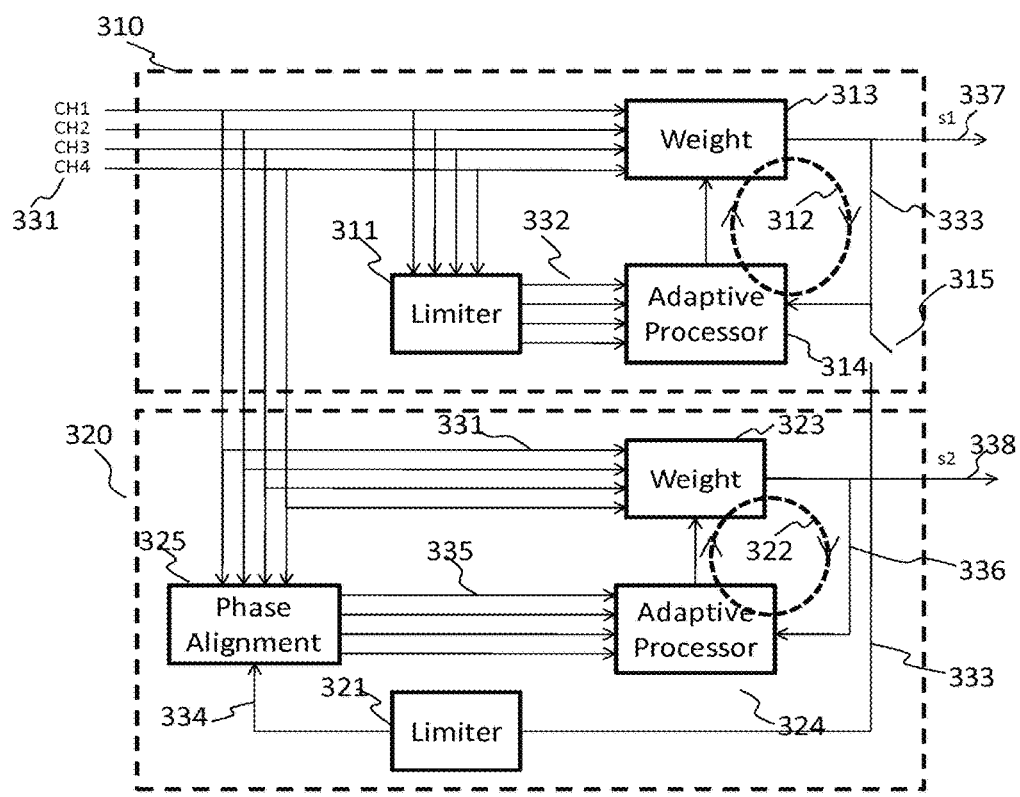
FIG. 3 illustrates a schematic view of the present signal differentiation system.

FIG. 3 gives the schematic view of our present signal identification scheme utilized by the digital signal processor 108. Input signals 331 coming from the multiple-element antenna array are routed through two adaptive processes 310, 320 which output the signal component with lower power 337, and the signal component with stronger power 338, respectively. In the first adaptive process 310, the composite signal is split, with a portion going to limiter 311, which converts a positive or zero signal sample into 1 and a negative signal sample into −1, and another portion going to the element weighting processor 313.

This invention focuses on eliminating unwanted signal components by adaptively minimizing the correlation between a desired signal and any unwanted components. Limiter 311 is used to generate four approximations 332 of the larger one of two signal components 331 in each channel as one input (the total number of inputs equaling the number of elements in the antenna array) to the adaptive processor 314 adaptively performing minimizing the correlation between a feedback signal 333, i.e. the above-mentioned desired signal, and approximation 332 of the larger one of the signal components 331. i.e the above-mentioned unwanted components. The other input 333 from the beam output 337 is generated by applying complex weight 313a which is a set of complex number to change the amplitude and phasea to each channel of input signals 331. The input signals 331 are then processed within iterative loop 312 until certain criteria are reached. In each iteration, the adaptive processor 314 updates the complex weight 313 to generate a new output signal 337. which also returns to the adaptive processor as feedback via the path 333. The loop stops either when the correlation of returned signal in the path 333 and approximation 332 of the larger one of the signal components 331 becomes smaller than a preset signal strength threshold, or the number of iterations reaches a predefined number. Since the phase of a signal 331 is determined mostly by the largest signal component of the signal 331. the output of the limiter 311 approximately reflects the signal component 332 with the strongest signal strength, and ignores all the amplitude information of input signals 331. The phase information is transmitted to the adaptive processor 314 where a closed adaptive loop 312 is used to iteratively eliminate the signal component which has the same phase as the strongest signal component 332, thus eliminating the strongest signal component of the signal 331. Similarly, other signal components can be eliminated if their phase information is known, or can be calculated, i.e. by their direction of arrival. As a result of the iterative processes. the process 310 identifies the smaller signal component in the smaller strength signal 337 output to the second loop to trigger the process 320 which is to identify the large signal component in the signal 338 with the stronger signal strength.

The second process 320 also includes an adaptive loop 322 which is very similar to the adaptive loop 312 in the first process 310. The difference is that the input signal to the second loop 335 is an approximation of the signal with smaller signal strength, comparative to one with the larger signal strength 332. A limiter 321 is used to generate an approximation 334 of the smaller strength signal 333 that is reconstituted at the output by the first adaptive process 310. A phase alignment module 325 is applied to align the phase of approximation signal 334 with the phase of smaller signal component in each channel of the original input signal 331 by applying four different complex weights to signal 334 according to their phase difference. The phase information of the smaller component of original input signal 331 can be calculated according to the directional or modulation information of the satellites. Similar to the first adaptive loop 312, the second loop terminates and outputs the stronger signal 338 when the correlation between the feedback 336 and input signal 335 become smaller than a preset threshold.

Figure 4:
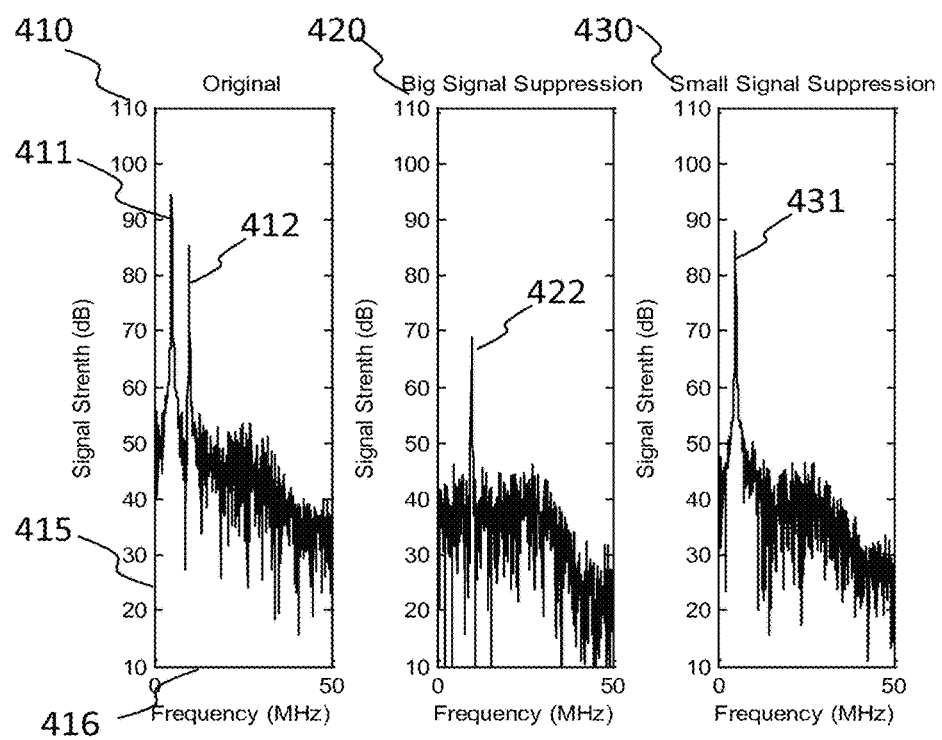
FIG. 4 presents several graphs showing the results of the adaptive signal differentiation algorithm, showing the original signal, suppression of the stronger signal, and suppression of the weaker signal

FIG. 4 demonstrates the result of our adaptive orthogonal beam forming scheme. Graph 410 shows the spectrum output of the original input signal 331. Graph 420 illustrates the spectrum output of the first adaptive process 337, showing how the stronger signal has been reduced to the level of background noise. Graph 430 shows the spectrum output of the second adaptive process 338, illustrating how the weaker strength signal has been reduced to the level of background noise as well. The frequency axis 416 spans from 0 to 50 MHz (megahertz). The vertical axis 415 which represents the signal strength ranges from 10 dB to 110 dB (decibels). As shown in spectrum graph 410, the original input signal includes two signal components 411, 412 which come from two satellites 101 and 102 as shown in FIG. 1. In the present simulation, the signal component 411 has stronger signal strength of more than 90 dB and a lower frequency. Using signals with different frequencies is for demonstration purposes. The present signal differentiation scheme can be adapted for other applications as well, such as differentiating two signals on the same frequencies if directional information of the satellites is known. Spectrums 420, 430 show the output of first and second adaptive process, respectively. In comparison with spectrum 410, only the smaller signal component 422 is left in spectrum 420, while only the large signal component 431 is shown in spectrum 430.

Figure 5:
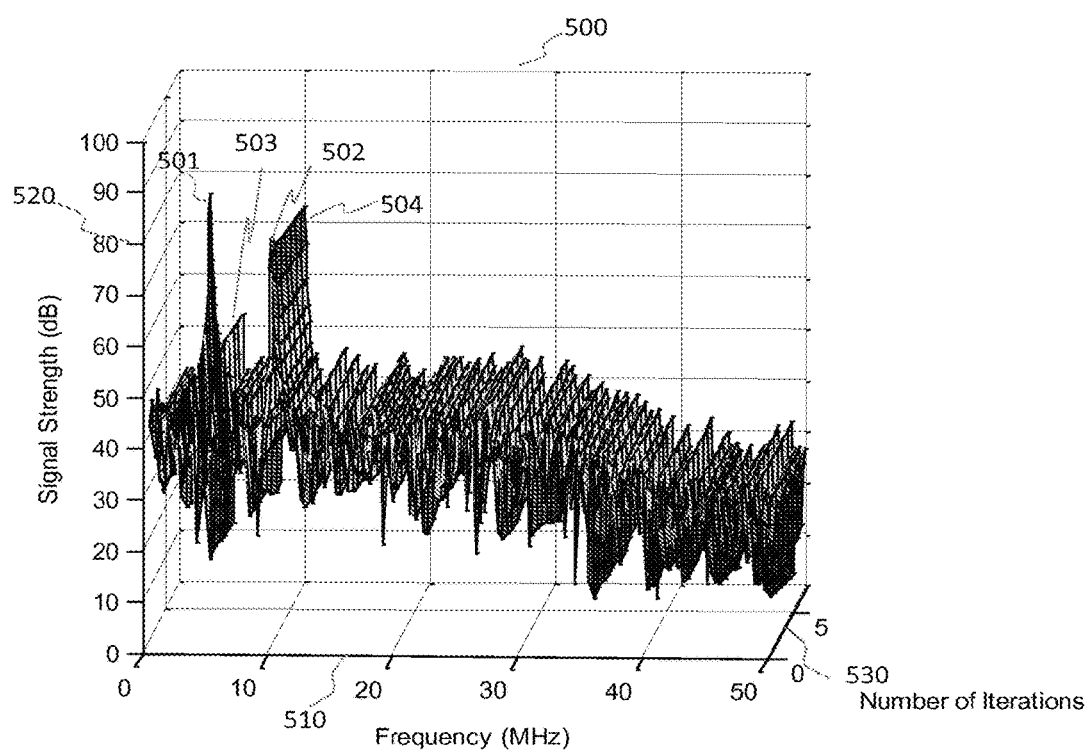
FIG. 5 depicts the suppression process of the signal with stronger signal strength

FIG. 5 is a 3-dimensional plot which illustrates the process of eliminating the signal with stronger signal strength in the first adaptive process 310. Frequency is represented on the x-axis 510, which ranges from 0 to 50 MHz. Signal strength is represented on the z-axis 520 ranges from 0 dB to 100 dB. The y-axis 530 represents the number of iterations performed to differentiate the signal, ranging from 0 to 8. Before the adaptive process begins (num of iteration=0), the signal component 501 has a larger signal strength than signal component 502. When the adaptive processing begins, the strength of signal 501 drops significantly with each iteration, eventually stabilizing as signal 503. At this point, signal 503 is roughly the same strength as the background noise. In comparison to signal 502, processed signal 503 is not in the same strength range. At the end of the adaptive processing (num of iteration=8), the remainder of the larger signal 503 is close to the noise level, whereas the strength smaller signal 504 has little to no change of signal strength taking place.

Figure 6:
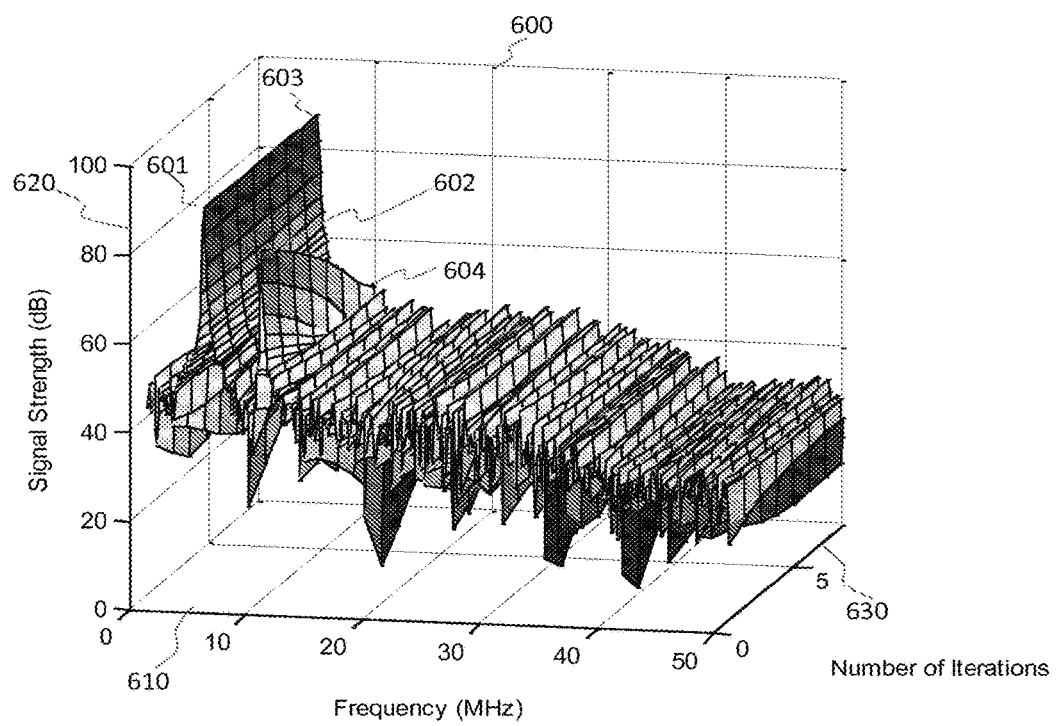
FIG. 6 illustrates the suppression process of the signal with smaller signal strength.

FIG. 6 illustrates the output of each loop of the second adaptive process. Frequency is again represented on the x-axis 610 in megahertz, the number of iterations is represented by the y-axis 630, and the signal strength in decibels is represented on the z-axis. Contrary to the first adaptive process shown in FIG. 5, the signal strength of the larger signal 602 remains relatively unchanged through each iteration. After 8 iterations signal 604 has the same signal strength as when the adaptive process began. However, signal strength of signal 601 dropped dramatically after 8 iterations to signal 603. Here, signal 603 has roughly the same signal strength as the background noise.

What is claimed is:

1. A signal processing unit comprising:
a first limiter configured to approximate a first value of a sample of a first signal having larger and smaller components and transmitted from at least a satellite into a second value corresponding to the larger component;
a first weighting processor configured to apply a first complex weight to the first signal so as to generate a second signal; and
a first adaptive processor configured to update the first complex weight using correlation between the second signal and the second value.

2. The signal processing unit of claim 1 further comprising a second limiter configured to approximate the second signal into a third signal and a phase alignment processor configured to align a phase of the smaller component in the first signal with a phase of the third signal so as to generate a fourth signal.

3. The signal processing unit of claim 2 further comprising a second weighting processor configured to apply a second complex weight to the first signal so as to generate a fifth signal and a second adaptive processor configured to update the second complex weight using correlation between the fourth and fifth signals.

4. The signal processing unit of claim 3 wherein the phase of the smaller component in the first signal is calculated based on directional or modulation information of the at least satellite.

5. The signal processing unit of claim 1, wherein the first adaptive processor is configured to update the first complex weight by minimizing the correlation between the second signal and the second value based on a first stopping criterion.

6. The signal processing unit of claim 5, wherein the first adaptive processor is configured to iteratively update the first complex weight until the correlation is less than a threshold.

7. The signal processing unit of claim 5, wherein the first adaptive processor is configured to iteratively update the first complex weight until a predetermined number of iterations is reached.

8. The signal processing unit of claim 1, wherein when the first complex weight is finally updated, the second signal retains the smaller component while suppressing the larger component.

9. The signal processing unit of claim 3, wherein when the second complex weight is finally updated, the fifth signal retains the larger component while suppressing the smaller component.

10. The signal processing unit of claim 1, wherein the first signal comes from an antenna array that receives signals from the at least satellite.

11. A signal processing unit comprising:
a weighting processor configured to apply a complex weight to a first input signal having a larger component and a smaller component so as to generate an output signal;
a limiter configured to approximate a second input signal which corresponds to the smaller component into a third input signal;
a phase alignment processor configured to align a phase of the smaller component with a phase of the third input signal so as to generate a fourth input signal;
an adaptive processor configured to update the complex weight based on correlation between the output signal and the fourth input signal.

12. The signal processing unit of claim 11 wherein the limiter converts a non-negative sample in the second input signal into a first value and a negative sample in the second input signal into a second value different from the first value.

13. The signal processing unit of claim 11, wherein the adaptive processor iteratively updates the complex weight according to a minimization process using the correlation between the output signal and the fourth input signal.

14. The signal processing unit of claim 11, wherein when the complex weight is finally updated, the output signal retains the larger component while suppressing the smaller component.

15. The signal processing unit of claim 11, wherein the first input signal comes from an antenna array.

16. A method comprising:
applying a first complex weight to a first signal so as to generate a second signal, the first signal having larger and smaller components;
approximating a first value of a sample of the first signal into a second value corresponding to the larger component;
updating the first complex weight using correlation between the second signal and the second value;
approximating the second signal into a third signal; and
aligning a phase of the smaller component in the first signal with a phase of the third signal so as to generate a fourth signal.

17. The method of claim 16 further comprising:
applying a second complex weight to the first signal so as to generate a fifth signal; and
updating the second complex weight using correlation between the fourth and fifth signals.

18. The method of claim 16 wherein the updating the first complex weight comprises iteratively updating the first complex weight by reducing the correlation between the second signal and the second value until a first stopping criterion is met.

19. The method of claim 17, wherein the updating the second complex weight comprises iteratively updating the second complex weight by reducing the correlation between the fourth and fifth signals until a second stopping criterion is met.

20. The method of claim 19, wherein when the second complex weight is finally updated, the fifth signal retains the larger component while suppressing the smaller component and the second signal retains the smaller component while suppressing the larger component.

* * * * *